United States Patent
Ou et al.

(10) Patent No.: US 12,333,106 B2
(45) Date of Patent: Jun. 17, 2025

(54) TOUCH DETECTION CIRCUITRY, ELECTRONIC DEVICE AND TOUCH EVENT HANDLING METHOD THEREOF

(71) Applicant: HIMAX TECHNOLOGIES LIMITED, Tainan (TW)

(72) Inventors: Yu Nian Ou, Tainan (TW); Chun Kai Chuang, Tainan (TW); Yu-Hsiang Lin, Tainan (TW); Chun-Lung Tsai, Tainan (TW)

(73) Assignee: HIMAX TECHNOLOGIES LIMITED, Tainan (TW)

(*) Notice: Subject to any disclaimer, the term of this patent is extended or adjusted under 35 U.S.C. 154(b) by 0 days.

(21) Appl. No.: 18/331,167

(22) Filed: Jun. 7, 2023

(65) Prior Publication Data

US 2024/0111377 A1    Apr. 4, 2024

Related U.S. Application Data

(60) Provisional application No. 63/377,349, filed on Sep. 28, 2022.

(51) Int. Cl.
*G06F 3/041* (2006.01)
*H03M 1/12* (2006.01)

(52) U.S. Cl.
CPC .......... *G06F 3/04162* (2019.05); *H03M 1/12* (2013.01)

(58) Field of Classification Search
CPC ..... G06F 3/04162; G06F 3/041; G06F 3/0416
See application file for complete search history.

(56) References Cited

U.S. PATENT DOCUMENTS

| | | |
|---|---|---|
| 2008/0162835 A1 | 7/2008 | Wilson et al. |
| 2011/0083042 A1 | 4/2011 | Chang et al. |
| 2012/0081301 A1 | 4/2012 | Lin et al. |
| 2013/0033435 A1 | 2/2013 | Raveendran et al. |
| 2013/0207938 A1* | 8/2013 | Ryshtun ............... G06F 3/0441 178/19.03 |
| 2014/0085226 A1 | 3/2014 | Li et al. |
| 2014/0267104 A1* | 9/2014 | Ahmed ............ G06F 3/041661 345/173 |
| 2014/0306903 A1 | 10/2014 | Huang et al. |
| 2017/0031503 A1 | 2/2017 | Rosenberg et al. |
| 2018/0107292 A1 | 4/2018 | Jang et al. |

(Continued)

FOREIGN PATENT DOCUMENTS

| | | |
|---|---|---|
| CN | 105190494 A | 12/2015 |
| CN | 107943339 A | 4/2018 |
| CN | 114995675 A | 9/2022 |

(Continued)

*Primary Examiner* — Kevin M Nguyen
(74) *Attorney, Agent, or Firm* — CKC & Partners Co., LLC

(57) ABSTRACT

A touch detection circuitry includes an analog-to-digital converter (ADC), a controller, and a packet generator. The ADC is arranged to convert touch signals of a touch panel from analog form into digital form. The controller is electrically connected to the ADC, and is configured to calculate at least one coordinate point and at least one touch size respectively corresponding to at least one touch event on the touch panel based on the touch signals. The packet generator is electrically connected to the controller, and is configured to encapsulate the at least one coordinate point and the at least one touch size into a touch data packet.

11 Claims, 3 Drawing Sheets

(56) References Cited

U.S. PATENT DOCUMENTS

2021/0397324 A1* 12/2021 Yu .................. G06F 3/04164

FOREIGN PATENT DOCUMENTS

| | | |
|---|---|---|
| JP | 2011-526396 A | 10/2011 |
| JP | 2018-032443 A | 3/2018 |
| TW | 201413500 A | 4/2014 |
| TW | 201520835 A | 6/2015 |

* cited by examiner

TOUCH DETECTION CIRCUITRY, ELECTRONIC DEVICE AND TOUCH EVENT HANDLING METHOD THEREOF

RELATED APPLICATIONS

This application claims priority to U.S. Provisional Application Ser. No. 63/377,349, filed Sep. 28, 2022, which is herein incorporated by reference.

BACKGROUND

Field of the Invention

The present disclosure relates to touch event detection for touch operations, and more particularly to a touch detection circuitry, an electronic device and a touch event handling method thereof with a touch event detection function for touch operations.

Description of Related Art

Panels with touch detection function are widely used in automotive systems in current days. The common applications of automotive panels are GPS navigation display, multimedia display, application operation, automotive system setting and so on. However, there is no unified packet format specification between IC suppliers and carplay suppliers, resulting in the need to spend extra time discussing and defining the packet format.

SUMMARY

One aspect of the present disclosure relates to a touch detection circuitry, which includes an analog-to-digital converter (ADC), a controller and a packet generator. The ADC is arranged to convert touch signals of a touch panel from analog form into digital form. The controller is electrically connected to the ADC, and the controller is configured to calculate at least one coordinate point and at least one touch size respectively corresponding to at least one touch event on the touch panel based on the touch signals. The packet generator is electrically connected to the controller, and the packet generator is configured to encapsulate the at least one coordinate point and the at least one touch event into a touch data packet.

In accordance with one or more embodiments of the present disclosure, the packet generator is configured to further encapsulate reserved information into the touch data packet.

In accordance with one or more embodiments of the present disclosure, the packet generator is configured to further encapsulate debug information into the touch data packet.

In accordance with one or more embodiments of the present disclosure, the debug information includes a at least one of a recalibration counter, a baseline update indicator, a palm touch event indicator, an idle mode indicator, a frequency hopping mode indicator, and a glove mode indicator.

In accordance with one or more embodiments of the present disclosure, the packet generator is configured to further encapsulate a checksum into the touch data packet.

In accordance with one or more embodiments of the present disclosure, the packet generator is configured to further encapsulate a number of the at least one touch event into the touch data packet.

In accordance with one or more embodiments of the present disclosure, the touch detection circuitry further includes a data communication interface, which is electrically connected to the packet generator and configured to transmit the touch data packet to an electronic device.

Another aspect of the present disclosure relates to an electronic device, which includes a touch panel with touch detection function, a touch detection circuitry and an application processor. The touch detection circuitry is electrically connected to the touch panel. The touch detection circuitry includes an ADC, which is arranged to convert touch signals of the touch panel from analog form into digital form. The touch detection circuitry includes a controller electrically connected to the ADC, and the controller is configured to calculate at least one coordinate point and at least one touch size respectively corresponding to at least one touch event on the touch panel based on the touch signals. The touch detection circuitry includes a packet generator electrically connected to the controller, and the packet generator is configured to encapsulate the at least one coordinate point and the at least one touch event into a touch data packet. The touch detection circuitry includes an application processor, which is configured to receive and decapsulate the touch data packet to obtain the at least one coordinate point and the at least one touch size respectively corresponding to the at least one touch event on the touch panel.

In accordance with one or more embodiments of the present disclosure, the packet generator is configured to further encapsulate reserved information into the touch data packet.

In accordance with one or more embodiments of the present disclosure, the packet generator is configured to further encapsulate debug information into the touch data packet.

In accordance with one or more embodiments of the present disclosure, the debug information includes a at least one of a recalibration counter, a baseline update indicator, a palm touch event indicator, an idle mode indicator, a frequency hopping mode indicator, and a glove mode indicator.

In accordance with one or more embodiments of the present disclosure, the packet generator is configured to further encapsulate a checksum into the touch data packet.

In accordance with one or more embodiments of the present disclosure, the packet generator is configured to further encapsulate a number of the at least one touch event into the touch data packet.

Yet another aspect of the present disclosure relates to a method for touch event handling. The method includes detecting at least one touch event on a touch panel to obtain touch signals. The method includes converting the touch signals from analog form into digital form. The method includes calculating at least one coordinate point and at least one touch size respectively corresponding to the at least one touch event based on the touch signals. The method includes encapsulating the at least one coordinate point and the at least one touch event into a touch data packet.

In accordance with one or more embodiments of the present disclosure, the method includes encapsulating reserved information into the touch data packet.

In accordance with one or more embodiments of the present disclosure, the method includes encapsulating debug information into the touch data packet.

In accordance with one or more embodiments of the present disclosure, the method includes the debug information, which further includes a at least one of a recalibration counter, a baseline update indicator, a palm touch event indicator, an idle mode indicator, a frequency hopping mode indicator, and a glove mode indicator.

In accordance with one or more embodiments of the present disclosure, the method includes encapsulating a checksum into the touch data packet.

In accordance with one or more embodiments of the present disclosure, the method includes encapsulating a number of the at least one touch event into the touch data packet.

In accordance with one or more embodiments of the present disclosure, the method includes transmitting the touch data packet to an electronic device, and the method further includes decapsulating, at the electronic device, the touch data packet by the electronic device to obtain the at least one coordinate point and the at least one touch size respectively corresponding to the at least one touch event on the touch panel.

BRIEF DESCRIPTION OF THE DRAWINGS

This disclosure can be more fully understood by reading the following detailed description of the embodiment, with reference made to the accompanying drawings as follows.

DETAILED DESCRIPTION

The detailed explanation of the present disclosure is described as following. The described preferred embodiments are presented for purposes of illustrations and description, and they are not intended to limit the scope of the present disclosure.

Terms used herein are only used to describe the specific embodiments, which are not used to limit the claims appended herewith. Unless limited otherwise, the term "a," "an," "one" or "the" of the single form may also represent the plural form.

Figure 1:
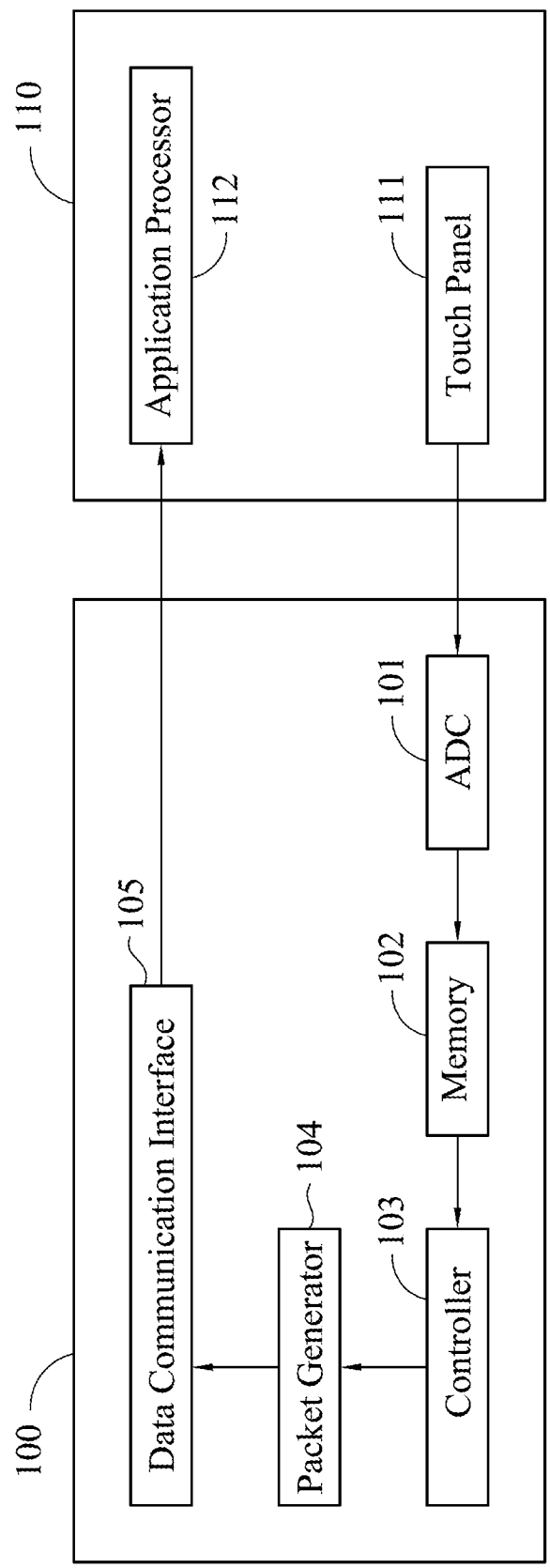
FIG. 1 is a functional block diagram of a touch detection circuitry and an electronic device in accordance with one embodiment of the present disclosure.

FIG. 1 is a functional block diagram of a touch detection circuitry 100 in accordance with one embodiment of the present disclosure. The touch detection circuitry 100 includes an analog-to-digital converter (ADC) 101, a memory 102, a controller 103, a packet generator 104 and a data communication interface 105. The ADC 101 is arranged to convert touch signals of a touch panel 111 from analog form into digital form. The touch signals may be generated by the touch panel 111 according to touch event(s) thereon. The memory 102 is configured to store the touch signals in the touch detection circuitry 100. The memory 102 may be a volatile memory, such as a static random access memory (SRAM), a dynamic random access memory (DRAM), and/or the like. The controller 103 is configured to calculate the coordinate point and the touch size corresponding to the touch event (or the coordinate points and the touch sizes respectively corresponding to the touch events) on the touch panel 111 based on the touch signals. The controller 103 may be, for example, a microcontroller unit (MCU), a microprocessor, an application-specific integrated circuit (ASIC), a programmable logic controller (PLC), or the like. The packet generator 104 is configured to encapsulate the coor-dinate point(s) and the touch event(s) into a touch data packet. The data communication interface 105 is configured to provide a communication path for the controller 103 to access the electronic device 110. The data communication interface 105 may be, for example, a serial peripheral interface (SPI) or another suitable interface, depending on the type of the electronic device 110. The controller 103 may transmit the touch data packet to the electronic device 110 via the data communication interface 105. After the touch data packet is transmitted to the electronic device 110, an application processor 112 of the electronic device 110 receives and decapsulate the touch data packet to obtain the coordinate point(s) and the touch size(s) respectively corresponding to the touch event(s) on the touch panel 111.

In one embodiment of the present disclosure, the packet generator 104 is configured to encapsulate the coordinate point(s) and the touch size(s) calculated by the controller 103 based on the touch signals. The packet generator 104 may be configured to further encapsulate reserved information, debug information and checksum into the touch data packet.

In one embodiment of the present disclosure, the debug information encapsulated into the touch data packet may include a recalibration counter, a baseline update indicator, a palm touch event indicator, an idle mode indicator, a frequency hopping mode indicator, and/or a glove mode indicator. The recalibration counter is used for mentor recalibraction trigger times while the touch signals from the touch panel 111 are abnormal, that is, the touch size is beyond a reasonable range. The baseline update indicator is used for monitoring whether a baseline update function is running. Because the baseline update is always running while there is no valid object detected, so the default of the baseline update indicator indicates that the baseline function is enabled. The palm touch event indicator is used for indicating whether a palm touch event or another abnormal touch event (e.g., with a very large touch size) is on the touch panel 111. The idle mode indicator is used for indicating whether the touch panel 111 is in an idle mode for power saving. When the touch panel 111 is in the idle mode, the touch panel 111 enters a power saving state, in which multiple sensor pads in the same receive (RX) channel of the touch panel 111 are sensed simultaneously, resulting in reduced sensing accuracy. On the contrary, when the touch panel 111 is in an normal mode (relative to the idle mode), the touch panel 111 leaves the power saving state, in which multiple sensor pads in the same RX channel of the touch panel 111 are sensed at different times for higher sensing accuracy. The frequency hopping mode indicator is for indicating the frequency band at which the touch panel 111 works. The glove mode indicator is used for indicating whether the touch panel 111 activates a glove mode (e.g., a high sensitivity mode for detecting a small touch signal).

In one embodiment of the present disclosure, the checksum encapsulated into the touch data packet is configured to check the integrity of transmitted data. In one example, the checksum may be determined from the following formula:

$$0 \times 100 - \left( \left( \sum_{k=0}^{55} \text{byte}(k) \right) \& 0 \times FF \right).$$

In one embodiment of the present disclosure, the packet generator 104 may handle at most ten touch events (e.g., by ten fingers of a user) on the touch panel 111, and the packet generator 104 may encapsulate one to ten touch events into the touch data packet. For example, if there are five touch events simultaneously on the touch panel 111, the packet generator 104 may encapsulate one to ten touch events into the touch data packet.

Figure 2:
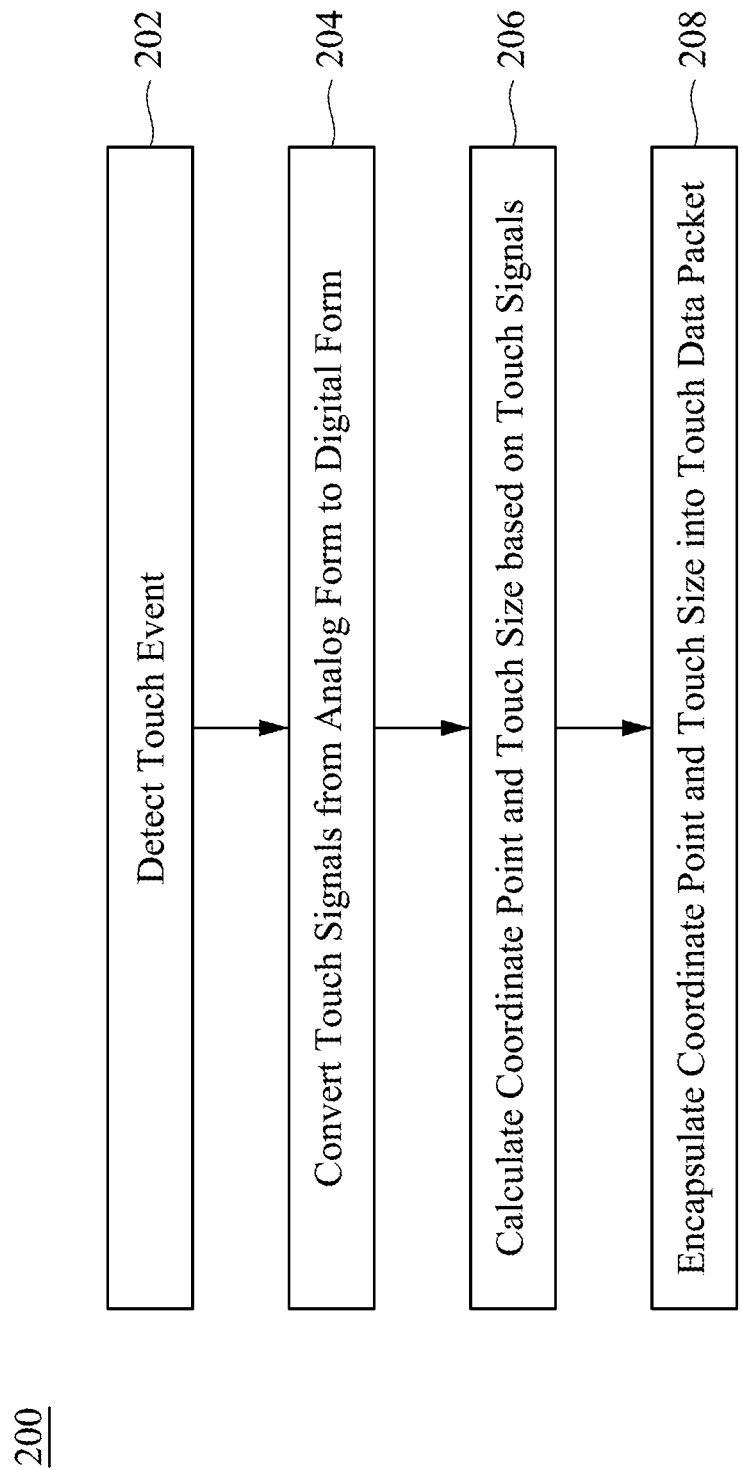
FIG. 2 is a flowchart of a touch event handling method in accordance with some embodiments of the present disclosure.

FIG. 2 is a flowchart of a touch event handling method 200 in accordance with some embodiments of the present disclosure. The touch event handling method 200 may be applied to the configuration shown in FIG. 1 or another similar configuration. The following takes the configuration shown in FIG. 1 as an example for description. In Step S202, the touch detection circuitry 100 is configured to detect a touch event on the touch panel 111, e.g., by a user's finger or a stylus. In Step S204, the ADC is configured to convert the touch signals from analog form into digital form. In Step S206, the controller 103 is configured to calculate the coordinate point and the touch size respectively corresponding to the touch event (or the coordinate points and the touch sizes respectively corresponding to the touch events) based on the touch signals. In Step S208, the packet generator 104 is configured to encapsulate the coordinate point(s) and the touch event(s) into a touch data packet.

In one embodiment of the present disclosure, after the touch data packet is transmitted to the electronic device 110 by the controller 103 via the data communication interface 105, the application processor 112 of the electronic device 110 receives and decapsulate the touch data packet to obtain the coordinate point(s) and the touch size(s) respectively corresponding to the touch event(s) on the touch panel 111.

Figure 3:
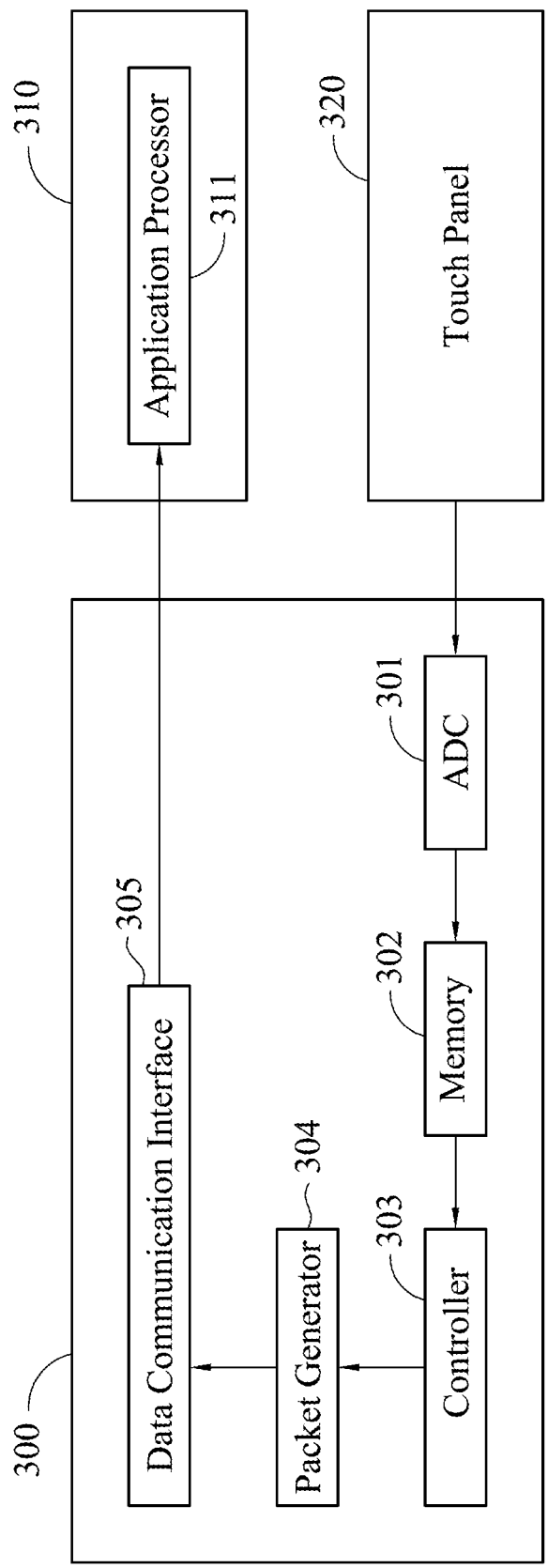
FIG. 3 is a functional block diagram of a touch detection circuitry and an electronic device in accordance with one embodiment of the present disclosure.

FIG. 3 is a functional block diagram of a touch detection circuitry 300 in accordance with one embodiment of the present disclosure. As shown in FIG. 1, the touch detection circuitry 300 includes an ADC 301, a memory 302, a controller 303, a packet generator 304 and a data communication interface 305, and an electronic device 310 with an application processor 311. On the other hand, a touch panel 320 is separated from the electronic device 310, which is different from FIG. 1.

The electronic device 310 may be, for example, an automotive infotainment display, a vehicle navigation device, and/or another suitable electronic device with touch detection and display functions. The electronic device 310 includes an application processor 311 for handling user applications. The application processor 311 may be a system on chip (SoC), a MCU, a microprocessor, etc. The touch panel 320 with touch detection function may have touch sensors arranged in an array. The touch detection circuitry 300 is coupled to the touch panel 320 for driving the touch panel 320 to perform touch detection. In some alternative embodiments, the touch panel 320 with touch detection function may be integrated into a display panel of the electronic device 310 to form a touch display panel. In certain embodiments, the touch detection circuitry 300 is a TDDI circuit for touch detection driving on the touch panel 320 as well as display driving on the electronic device 310. The controller 303 of the touch detection circuitry 300 may transmit the coordinate point(s) and the touch size(s) corresponding to the touch event(s) on the touch panel 320 to the application processor 311 further operations, such as map application, audio or video playing, etc.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of this disclosure. In view of the foregoing, it is intended that the present disclosure cover modifications and variations of this disclosure provided they fall within the scope of the following claims.

What is claimed is:

1. A touch detection circuitry, comprising:
   an analog-to-digital converter (ADC) arranged to convert touch signals of a touch panel from analog form into digital form;
   a controller electrically connected to the ADC, the controller configured to calculate at least one coordinate point and at least one touch size respectively corresponding to at least one touch event on the touch panel based on the touch signals; and
   a packet generation circuit electrically connected to the controller, the packet generation circuit configured to encapsulate the at least one coordinate point, and the at least one touch size, and debug information, and a checksum into a touch data packet,
   wherein the debug information comprises a recalibration counter, and a baseline update indicator, and a palm touch event indicator, and an idle mode indicator, and a frequency hopping mode indicator, and a glove mode indicator.

2. The touch detection circuitry of claim 1, wherein the packet generation circuit is configured to further encapsulate reserved information into the touch data packet.

3. The touch detection circuitry of claim 1, wherein the packet generation circuit is configured to further encapsulate a number of the at least one touch event into the touch data packet.

4. The touch detection circuitry of claim 1, further comprising:
   a data communication interface electrically connected to the packet generation circuit and configured to transmit the touch data packet to an electronic device.

5. An electronic device, comprising:
   a touch panel with touch detection function;
   a touch detection circuitry electrically connected to the touch panel, the touch detection circuitry comprising:
   an ADC arranged to convert touch signals of the touch panel from analog form into digital form;
   a controller electrically connected to the ADC, the controller configured to calculate at least one coordinate point and at least one touch size respectively corresponding to at least one touch event on the touch panel based on the touch signals; and
   a packet generation circuit electrically connected to the controller, the packet generation circuit configured to encapsulate the at least one coordinate point, and the at least one touch size, and debug information, and a checksum into a touch data packet; and
   an application processor configured to receive and decapsulate the touch data packet to obtain the at least one coordinate point and the at least one touch size respectively corresponding to the at least one touch event on the touch panel,
   wherein the debug information comprises a recalibration counter, and a baseline update indicator, and a palm touch event indicator, and an idle mode indicator, and a frequency hopping mode indicator, and a glove mode indicator.

6. The electronic device of claim 5, wherein the packet generation circuit is configured to further encapsulate reserved information into the touch data packet.

7. The electronic device of claim 5, wherein the packet generation circuit is configured to further encapsulate a number of the at least one touch event into the touch data packet.

8. A method for touch event handling, the method comprising:

detecting at least one touch event on a touch panel to obtain touch signals;

converting the touch signals from analog form into digital form;

calculating at least one coordinate point and at least one touch size respectively corresponding to the at least one touch event based on the touch signals; and encapsulating the at least one coordinate point, and the at least one touch size, and debug information, and a checksum into a touch data packet, wherein the debug information comprises a recalibration counter, and a baseline update indicator, and a palm touch event indicator, and an idle mode indicator, and a frequency hopping mode indicator, and a glove mode indicator.

9. The method of claim 8, further comprising:

encapsulating reserved information into the touch data packet.

10. The method of claim 8, further comprising:

encapsulating a number of the at least one touch event into the touch data packet.

11. The method of claim 8, further comprising:

transmitting the touch data packet to an electronic device; and decapsulating, at the electronic device, the touch data packet by the electronic device to obtain the at least one coordinate point and the at least one touch size respectively corresponding to the at least one touch event on the touch panel.

\* \* \* \* \*